(12) United States Patent
Pentakota et al.

(10) Patent No.: US 7,129,740 B2
(45) Date of Patent: Oct. 31, 2006

(54) LOW NOISE OUTPUT BUFFER

(75) Inventors: Visvesvaraya A. Pentakota, Bangalore (IN); Nagarajan Viswanathan, Bangalore (IN); Sanjib Basu, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 54 days.

(21) Appl. No.: 10/722,415

(22) Filed: Nov. 28, 2003

(65) Prior Publication Data

US 2005/0116737 A1   Jun. 2, 2005

(51) Int. Cl.
*H03K 19/003* (2006.01)
*H03K 5/12* (2006.01)

(52) U.S. Cl. .......................... 326/31; 326/21; 327/170

(58) Field of Classification Search ............... 326/21, 326/26–29, 31, 32, 34; 327/170, 134, 380, 327/381
See application file for complete search history.

(56) References Cited

U.S. PATENT DOCUMENTS 6,271,699 B1 * 8/2001 Dowlatabadi ............... 327/170
6,617,897 B1 * 9/2003 Lee ........................... 327/170
6,777,974 B1 * 8/2004 Eichfeld et al. ............. 326/26

* cited by examiner

*Primary Examiner*—James H. Cho
(74) *Attorney, Agent, or Firm*—W. James Brady; Frederick J. Telecky, Jr.

(57) ABSTRACT

The strength of the output buffer is changed gradually when there is a transition in the output (or input) value. Due to the gradual change, switching noise is avoided in several contexts (e.g., when driving a transmission line, which causes reflections). In an embodiment, the gradual change is implemented using a combination of a current source and a capacitor. The capacitor is provided at an input of the gate terminal of a drive transistor, and a current source is used to control the rate at which the capacitor discharges. As a result, the drive strength of a buffer is controlled.

49 Claims, 10 Drawing Sheets

LOW NOISE OUTPUT BUFFER

RELATED APPLICATION

The present application is related to co-pending U.S. application entitled, "Adjusting the Strength of Output Buffers", Ser. No. 10/397,421, filed on Mar. 27, 2003, naming as inventors: Udupa et al, and assigned to common assignee.

BACKGROUND OF THE INVENTION

1. Field of the Invention

The present invention relates to integrated circuits, and more specifically to a low noise output buffer suitable in several environments (e.g., to drive a transmission line which causes reflections).

2. Related Art

Output buffers are often used to drive external load (e.g., another integrated circuit or transmission line) based on data received from another source. In general, output buffers need to drive external loads with sufficient strength to ensure that the data is accurately transferred to the external devices within a pre-specified time duration.

One desirable feature of operation of output buffers is reducing noise. Noise generally refers to undesirable signal components present/introduced into a signal otherwise of interest. Reduction of noise generally leads to several advantages, as is well known in the relevant arts.

Noise can be introduced from a variety of sources. For example, switching noise generally refers to undesirable noise which is typically generated when there is transition of the signal at the output node (of the output buffer) from one value to the other.

There are other sources of noise as well. For example, when driving a transmission line (e.g., telephone line using DSL technology), the reflections may also introduce noise, which is again undesirable. Accordingly, it is generally desirable to provide output buffers which generate low noise.

BRIEF DESCRIPTION OF THE DRAWINGS

The present invention will be described with reference to the following accompanying drawings described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview.

An aspect of the present invention changes the drive strength of an output buffer gradually when there is a change in the input value (which is then provided as an output value by the output buffer). The gradual change may reduce various types of noise, which may be otherwise introduced.

In one embodiment, the gradual change is attained by using a current source to control the rate at which capacitors at the gate terminal of the drive transistors charge or discharge. For example, in the case of an output buffer implemented using an NMOS transistor and a PMOS transistor, the voltage at the gate terminal of the PMOS transistor is gradually decreased using one current source-capacitor combination at the gate terminal of the PMOS transistor to achieve a corresponding control of the rise time (0 to 1). The fall time is similarly controlled by using another current source-capacitor combination at the gate terminal of the NMOS transistor.

The rate of change of the drive strength can be designed to be constant, i.e., independent of factors such as changes in process, temperature, voltage (PTV), and external load. The constant rate is achieved by varying the current supplied by the current sources to keep the time of charging/discharging constant. As a result, the switching noise is avoided/reduced even when PTV conditions and/or load changes.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

Figure 1:
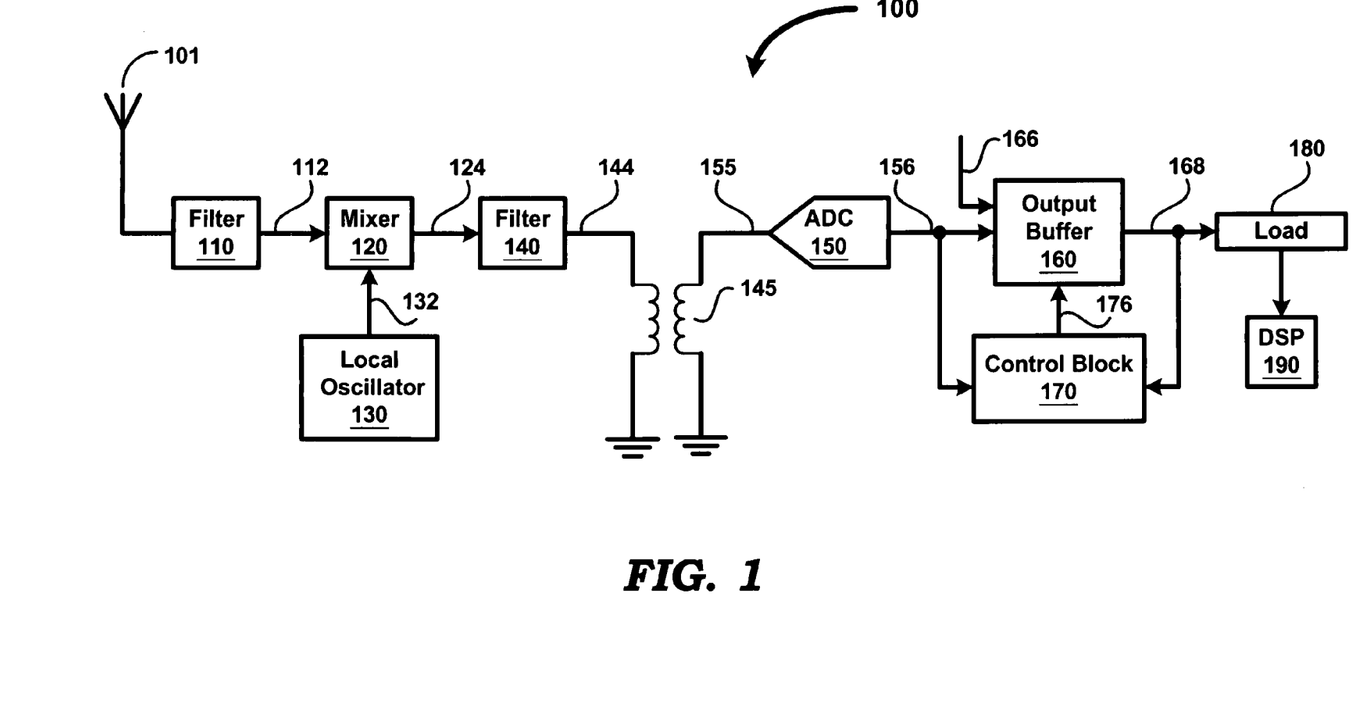
FIG. 1 is a block diagram illustrating an example system in which the present invention may be implemented.

FIG. 1 is a block diagram of wireless base station system 100 illustrating an example system in which the present invention may be implemented. For illustration, it is assumed that wireless base station system 100 is implemented to transfer signals corresponding to mobile phone, etc. However, various aspects of the present invention can be implemented in other communication systems (e.g., data processing systems, etc.).

Wireless base station system 100 is shown containing antenna 101, filters 110 and 140, mixer 120, local oscillator 130, transformer 145, analog to digital converter (ADC) 150, output buffer 160, control block 170, transmission line 180, and digital signal processor (DSP) 190. Each component is described in further detail below.

Antenna 101 may receive various signals transmitted from mobile phones, other wireless base stations, etc. The received signals may be provided to filter 110. Filter 110 may perform a corresponding transfer function to generate signals of the frequencies of interest. The generated signals are provided on path 112 to mixer 120. Antenna 101 and filter 110 may be implemented in a known way.

Local oscillator 130 generates a signal with a fixed frequency and provides the fixed frequency signal on path 132. In an embodiment, the signal (on path 132) of fixed frequency may be generated by a phase locked loop, crystal, etc., in a known way.

Mixer 120 may be used to convert a high frequency signal to a signal having any desired frequency. In an embodiment, a signal of frequency 1575 MHz is converted to a 4 Mhz signal. Mixer 120 receives filtered signal on path 112 and a signal of fixed frequency on path 132 as inputs and provides the signal with a desired frequency on path 124.

Filter 140 removes any noise components that may be present in the signal received on path 124. In general, mixers often introduce noise and the output of mixer contains various noise components along with the signal with desired frequency. Filter 140 removes the undesired components, and provides the signal with desired frequency only on path 144. Mixer 120, local oscillator 130, and filter 140 may also be implemented in a known way.

Transformer 145 amplifies the signal received on path 144 to generate an amplified signal. The amplified signal may be provided to analog to digital converter (ADC) 150 on path 155. ADC 150 converts the analog signal received on path 155 to a corresponding digital code. The digital code is provided on path 156 to output buffer 160.

Output buffer 160 receives the data on input path 156 at time points specified by clock signal received on path 166, and drives an external load (transmission line 180) to transmit the received data to the external devices. Transmission line 180 transfers the output of output buffer 160 to DSP 190. DSP 190 (example of a processing block) receives the digital code to provide various user applications (such as telephone calls, data applications).

Control block 170 adjusts the strength of output buffer 160 gradually when the output value changes (e.g., from 1 to 0 or vice versa). Control block 170 may be integrated into output buffer 160 in a common integrated circuit (die).

Figure 2A:
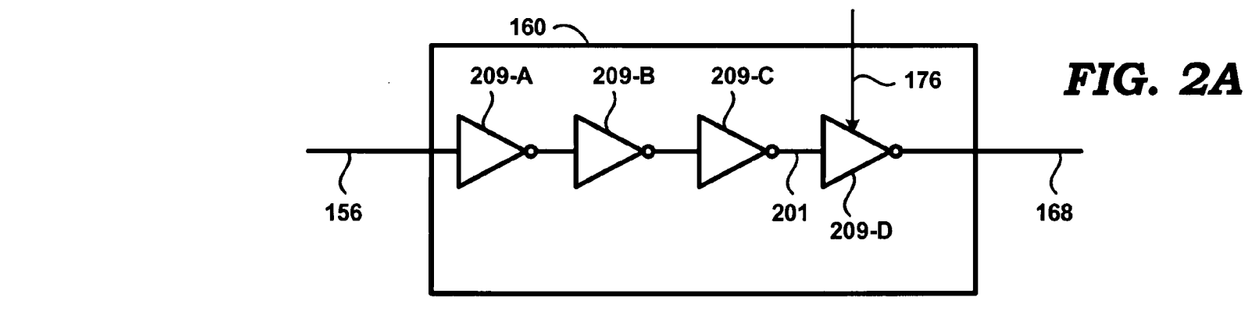
FIG. 2A is a block diagram illustrating the details of an output buffer in one embodiment.

In one embodiment shown in FIG. 2A, output buffer 160 is implemented as multiple even number of inverters (209-A through 209-D) connected in series. The signal on path 201 represents the inversion of signal on path 156. The strength of output buffer 160 may be changed by changing the strength of the last inverter 209-D in such an embodiment. The manner in which such adjustments can be made is described below with several examples.

3. Control block

Figure 2B:
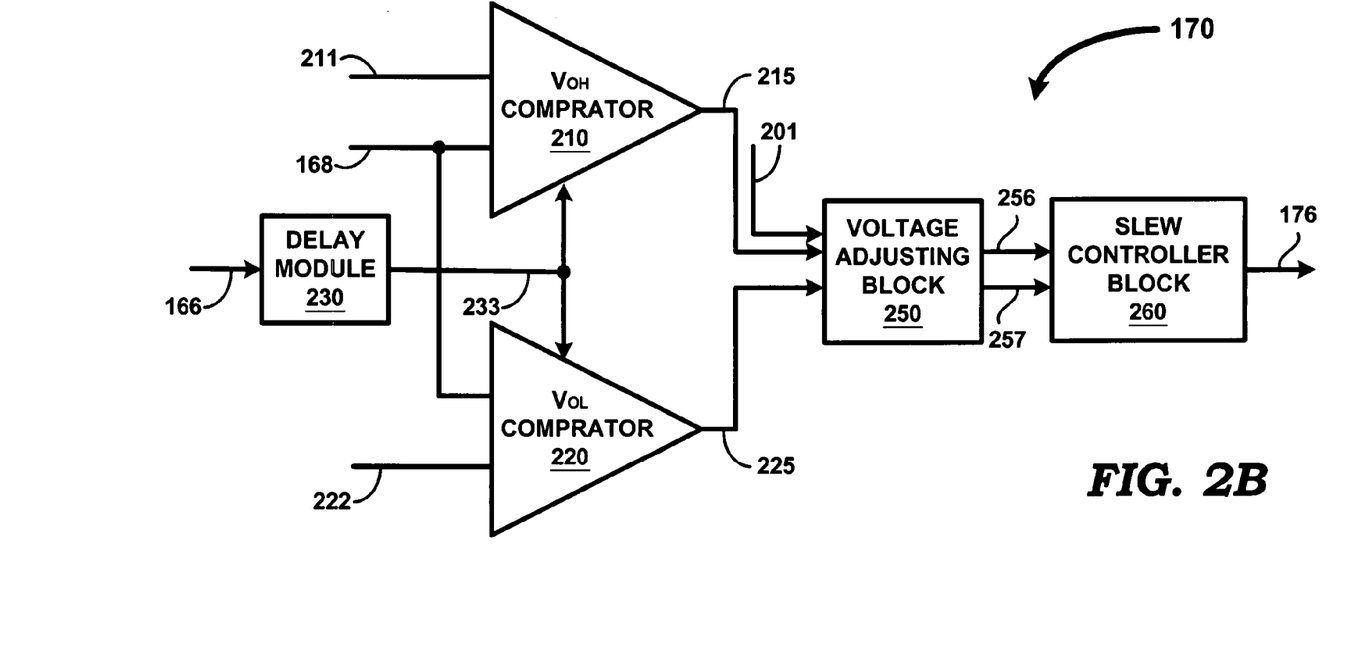
FIG. 2B is a block diagram illustrating the details of a control block in an embodiment of the present invention.

FIG. 2B is a block diagram illustrating the details of control block 170 in an embodiment of the present invention. Control block 170 is shown containing $V_{OH}$ comparator 210, $V_{OL}$ comparator 220, delay module 230, voltage adjusting block 250, and slew controller block 260. Each component is described below.

Delay module 230 generates a delayed version of clock signal received on path 166 and provides the delayed signal 'clkd' on path 233. The extent of delay may be determined by the desired rate with which the output signal of output buffer 160 (last inverter 209-D) on path 168 may need to change in response to a change in input signal on path 156. Delay module 230 may be implemented in a known way.

$V_{OH}$ comparator 210 compares the voltage level of output signal on path 168 with a high threshold voltage ($V_{OH}$) received on path 211, and generates a corresponding result on path 215. The comparison may be performed at a time point specified by clkd received on path 233. $V_{OH}$ generally represents a high voltage level which is used as a basis to determine the rate of change of the output signal when the output signal is transitioning from 0 to 1. In an embodiment, $V_{OH}$ approximately equals the voltage level representing 1.

As may be appreciated, by choosing an appropriate voltage level for $V_{OH}$ and/or by controlling the delay introduced by delay module 230, the result of comparison may be made to indicate whether the output signal on path 168 is rising faster or slower compared to a desired rate. In general, the desired rate is to be chosen such that the transition occurs slowly, but reaches a desired steady state voltage within design requirements.

$V_{OL}$ comparator 220 similarly generates a signal on path 225 indicating whether the output signal on path 168 is falling slower or faster than a desired rate. The signal on path 225 is generated by comparing the output signal on path 168 with a low threshold voltage ($V_{OL}$) received on path 222 at the time point specified by clkd received on path 233. $V_{OL}$ generally represents a low voltage level which is used as a basis to determine the rate of change of the output signal when the output signal is transitioning from 1 to 0. In an embodiment, $V_{OL}$ approximately equals the voltage level representing 0. $V_{OH}$ comparator 210 and $V_{OL}$ comparator 220 may be implemented in a known way.

Figure 6:
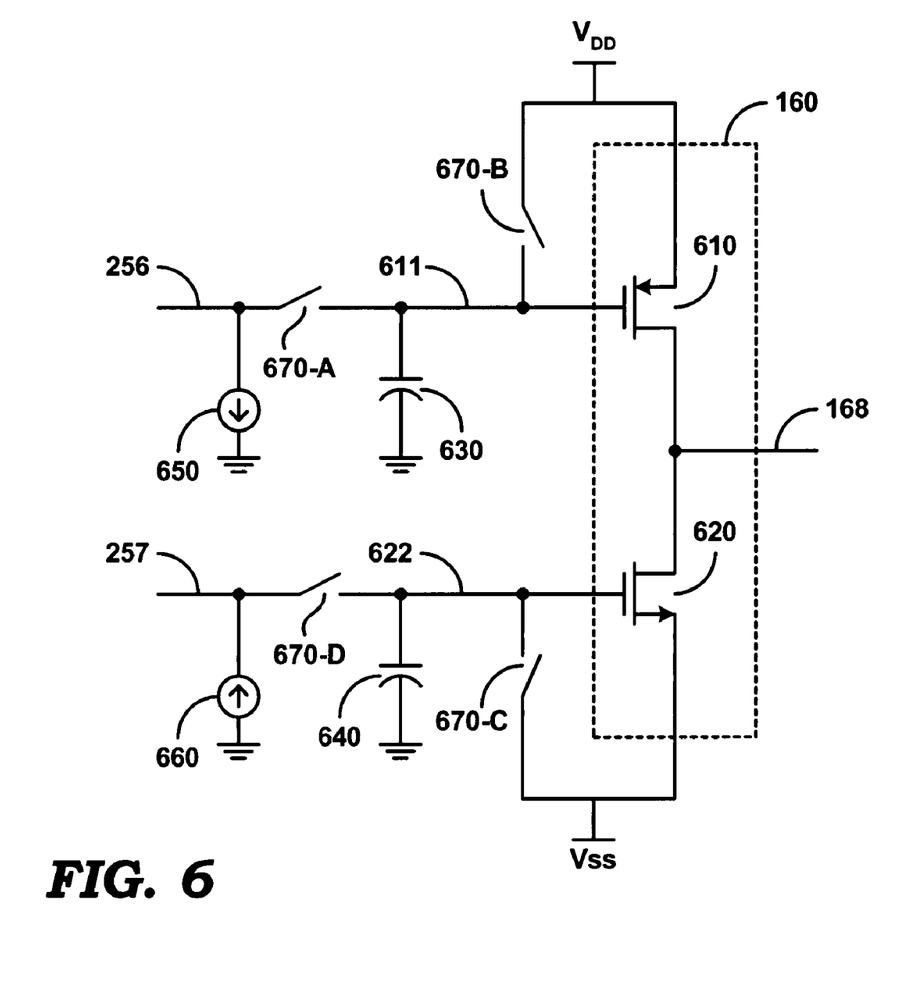
FIG. 6 is a circuit diagram illustrating the principle underlying the manner in which the strength of a buffer can be changed gradually according to an aspect of the present invention.

Voltage adjusting block 250 adjusts the total drive strength, and generates the corresponding gate voltages PCTRL and NCTRL on paths 256 and 257 respectively to drive the transistors in the last inverter 209-D of output buffer 160 (shown in FIG. 6). The adjustment is based on the comparison results 215 and 225.

In an embodiment, voltage adjusting block 250 causes changes to strength (of output buffer 160) with respect to rising edges based on the results received on path 215, and with respect to falling edges based on the results received on path 225. The determination of presence of a transition and whether the transition represents a rising or a falling transition, may be made by using an internal memory to store a previous input value received on path 201 and comparing a present value also received on path 201.

For example, if a result on path 215 represents a 'greater than' value, voltage adjusting block 250 may increase PCTRL on path 256 to decrease the strength of output buffer 160 corresponding to rise time. Similarly, PCTRL may be reduced to increase the strength with respect to rise time. The strength with respect to fall time may be changed based on the results received on path 225. Thus, PCTRL and NCTRL respectively represent the desired total drive strength with respect to rising and falling edges at path 168.

Slew controller block 260 ensures that the change of strength (to the desired total drive strength) is gradual (or slew/slope is low) for each transition of output value. Due to the gradual change, the switching noise is reduced. The manner in which slew controller block 260 can be implemented is described in further detail in sections below. The approaches of the present invention may be appreciated by understanding an embodiment in which one or more features of the present invention are not implemented.

4. Embodiment Not Adjusting the Strength Gradually

Figure 3:
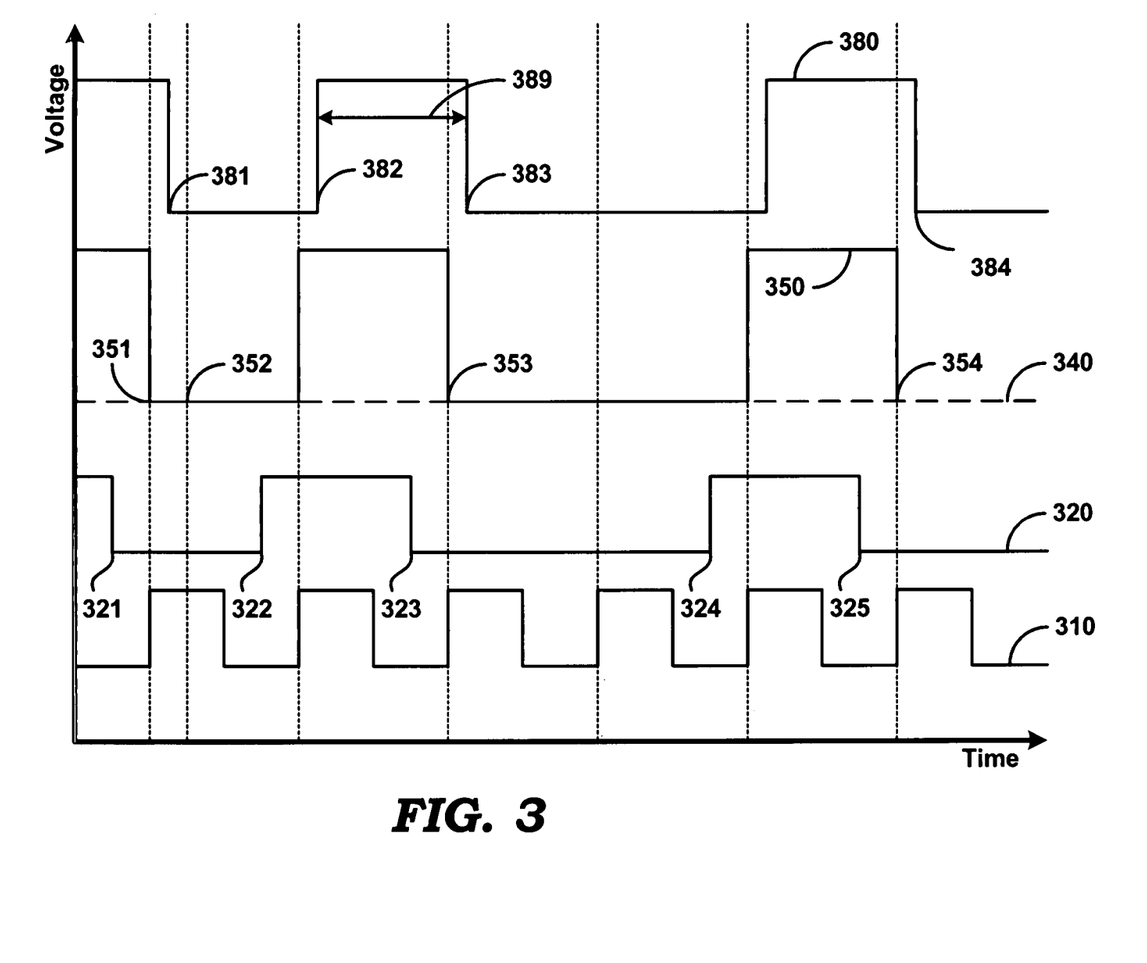
FIG. 3 is a timing diagram depicting the signals in an embodiment which does not change the strength of an output buffer gradually.

FIG. 3 is a timing diagram illustrating the operation of an embodiment in which one or more features of the present invention are not implemented. For illustration, the embodiment is described with reference to FIG. 1. The timing diagram is shown containing signals 310, 320, 350, and 380 representing the voltage levels on paths 166, 201, 176, and 168 respectively. Line 340 (shown as dotted line) represents PCTRL provided on path 256 of FIG. 2B in a steady state (i.e., after adjustments to total drive strength are made based on values received on path 225).

Signal 310 represents the clock signal. Signal 320 is shown transitioning from logic high to logic low at time points 321, 323 and 325, and from logic low to logic high at time points 324 and 325.

Signal 380 is shown falling steeply at time points 381, 383 and 384 corresponding to each falling transition (at time points 321, 323, and 325). As a result, the output of output buffer 160 transitions from logic high to low with a high slew. Similarly, the strength may change with a high slew during transitions from logic low to high. The amount of time the output of output buffer 160 is valid (at a constant value) in one cycle of signal 310 is represented by 389 between 382 and 383. Such steep transitions at the output may be presented due to signal 176 as described below.

Signal 176 is shown falling steeply at time points 351, 353 and 355 corresponding to each falling transition (at time points 321, 323, and 325). As a result, the strength of output buffer 160 (and also the output of output buffer 160) may also change with a high slew during transitions from logic high to low. Similarly, the strength may change with a high slew during transitions from logic low to high.

The change of strength with a high slew may lead to switching noise. For example, with reference to FIG. 1, reflections received at time point 352 may cause noise. For example, the reflections may cause the signal at output of output buffer to switch faster. The fast rate switching would draw a current from supply also at fast rate (di/dt) due to the inductance (L) of supply and ground pins.

The voltage drop (Ldi/dt) at supply and ground pins increases due to the switching noise. As a result, the voltage drop from the supply represents the switching noise, which may interfere with the operation of various analog components (e.g., ADC). Such interference limits the performance (SNR) of analog components, and is therefore undesirable. Various aspects of the present invention avoid/reduce such switching noise by increasing the strength of output buffers gradually as described with examples.

5. Desired Manner of Adjustment of Drive Strength

Figure 4:
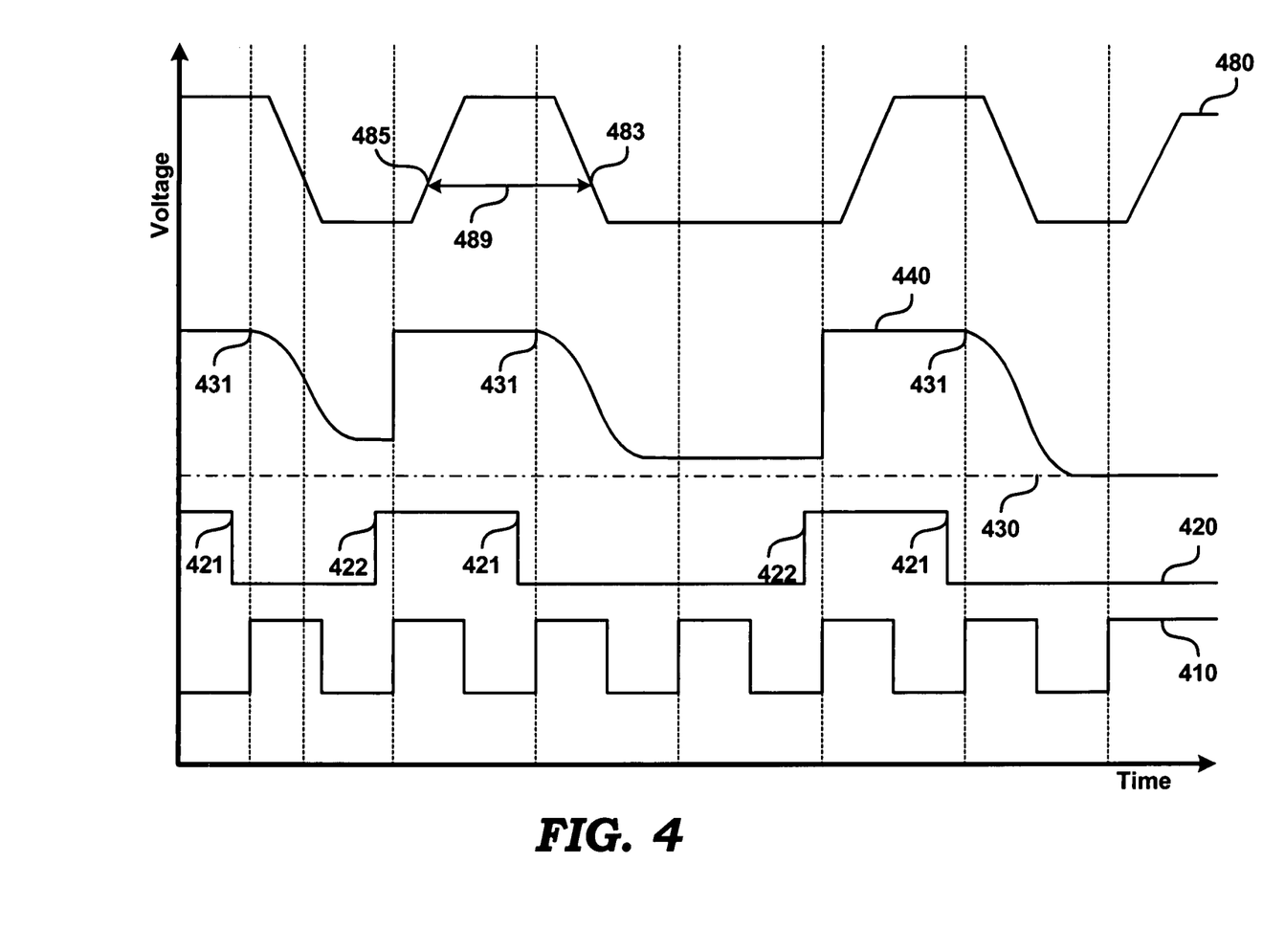
FIG. 4 is a timing diagram illustrating the manner in which the strength of an output buffer can be changed gradually when the aggregate strength of a buffer already equals an ideal desirable strength in one embodiment of the present invention.
Figure 5:
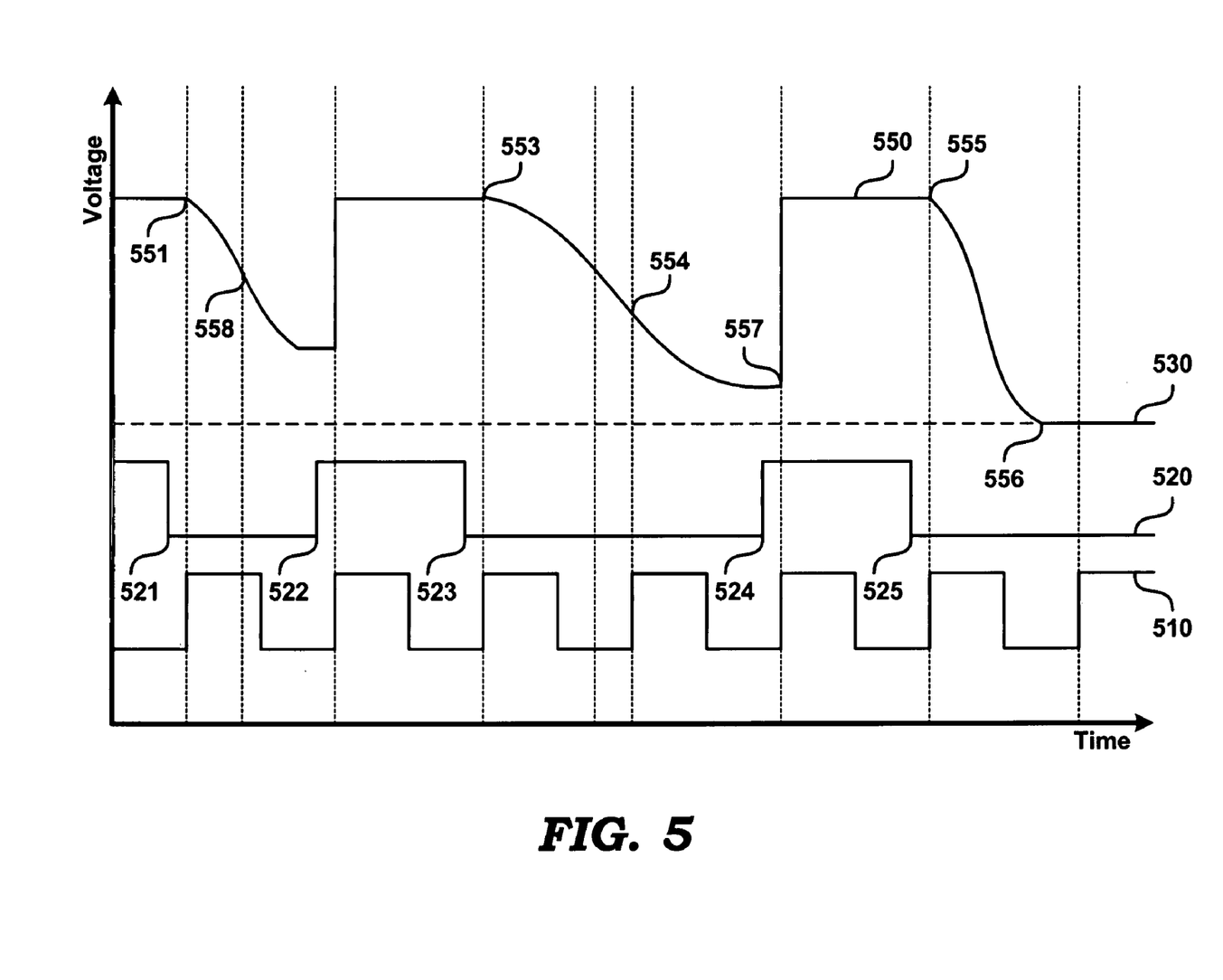
FIG. 5 is a timing diagram illustrating the manner in which the strength of an output buffer can be changed gradually when the aggregate strength of a buffer does not equal an ideal desirable strength in one embodiment of the present invention.

FIGS. 4 and 5 are timing diagrams together depicting the manner in which the strength of output buffer 160 may be adjusted gradually in an embodiment of the present invention. In particular, FIG. 4 depicts the changes in the signals once voltage adjusting block 250 has determined the appropriate total drive strength for a given set of operating conditions (PTV, load combination), and FIG. 5 the corresponding signals before such a determination.

With respect to FIG. 4, signals 410, 420, 440 and 480 represent the voltage levels on paths 166, 201, 176 and 168 respectively. Signal 410 represents the clock signal. Signal 420 is shown transitioning from logic low to logic high at time points represented by 421. Signal 420 is shown transitioning from logic high to logic low at time points represented by 422.

Signal 480 is also shown changing gradually from logic low to high and logic high to low corresponding to time points represented by 421 and 422 respectively. Since signal 480 changes gradually, switching noise (including those due to reflections) due to transitions may be reduced. It may be observed that the amount of time the output of output buffer 160 is valid (at a constant value at 0/1) in one cycle of signal 410 is represented by 489, and equals duration 389 of FIG. 3 due to similar gradual change during both rise and fall times. The signals that enable signal 480 to change gradually are described below.

Signal 430 (shown as dotted line) represents PCTRL provided on path 256 of FIG. 2B in a steady state (i.e., after adjustments to total drive strength are made based on values received on path 225).

Signal 440 represents the manner in which the drive strength is gradually changed (for each falling transition) in an embodiment of the present invention as shown starting at time points represented by 431. The manner in which the drive strength can be adjusted gradually is described with examples in sections below.

Merely for conciseness, the manner in which drive strength is adjusted gradually for falling transitions is described. Similarly, drive strength may be adjusted gradually for rising transitions as well. As a result of gradual change of the drive strength, output of output buffer 160 represented by signal 380 may also change gradually (in the case of both 0 to 1 transitions, and 1 to 0 transitions). Noise may be reduced due to such gradual change of the strength of the buffer.

Continuing with reference to FIG. 5, signals 510, 520, and 550 represent the signals on paths 166, 201, and 176 respectively. Signal 510 represents the clock signal. Signal 520 is shown switching from logic high to logic low at time points 521, 523 and 525, and switching from logic low to logic high at time points 524 and 525.

Signal 530 (shown as dotted line) represents the desired drive strength under the present operating conditions, and as described below the actual drive strength slowly converges to the desired level.

Signal 550 illustrates that the manner in which the drive strength of output buffer 160 may be adjusted gradually. The gradual adjustment is shown in time durations 551–552, 553–554, and 555–556 corresponding to the falling transitions at time points 521, 523 and 525.

In addition, due to the operation of voltage adjusting block 250 described above, the total drive strength is shown increasing step by step to eventually reach the desired level represented by signal 530.

As may be further observed, when there is no transition on input signal 520, the drive strength may remain the same as shown in duration 554–557.

Further more, any reflections due to a medium (e.g. transmission line), for example at time point 558, are countered since the increasing drive strength of output buffer 160 may override the reflections. In addition, the output on path 168 changes gradually since the strength of output buffer 160 is adjusted gradually. As a result, the noise due to any PVT and load variations may be reduced since the output is switching gradually.

It should be appreciated that the transitions of FIG. 3 are shown changing at 90° angle to reflect the manner in which a prior circuit seeks to change the output signal of the output buffer (due to the use of voltage sources). However, due to the inherence capacitance of the electrical components in the path, the signals may reach a desired level within about 15% of the clock cycle.

In contrast, due to various aspects of the present invention, as illustrated with reference to FIGS. 4 and 5, the signals may reach a desired level gradually (due to the use of current source). In an embodiment, the desired voltage is reached in about 60% of the clock cycle duration.

The manner in which such gradual adjustment may be implemented is described below with reference to FIG. 6.

6. Principle

FIG. 6 is a circuit diagram illustrating the principle according to an aspect of the present invention. The circuit diagram is shown containing PMOS transistor 610, NMOS transistor 620, capacitors 630 and 640, current sources 650 and 660, and switches 670-A through 670-D. Transistors 610 and 620 would be contained within last inverter 209-D of output buffer 160, and the remaining components in slew controller block 260. Each component is described below in further detail.

Capacitors 630 and 640 respectively represent the capacitance present at the gate terminal of transistors 610 and 620. The capacitance may be attained partially or fully by the gate capacitance integral to the gate terminals, and additional capacitors may be employed as desired by a designer.

Capacitor 630 is charged to $V_{DD}$ (or, in general, to such voltage which switches off transistor 610) when switches 670-B and 670-A are respectively in ON and OFF states, and is discharged (via current source 650) to the voltage level on path 256 when switches 670-B and 670-A are respectively in OFF and ON states. Similarly, capacitor 640 is charged (via current source 660) to the voltage level on path 257 when switches 670-D and 670-C are respectively in ON and OFF states, and is discharged to $V_{SS}$ (or to the voltage which switches off transistor 620) when switches 670-D and 670-C are respectively in OFF and ON states.

Transistors 610 and 620 form the drive transistors in last transistor 209-D of output buffer 160, the output (connected to path 168) of which drives a load (e.g. transmission line). PMOS transistor 610 controls the rise time of the buffer output and NMOS transistor 620 controls the fall time of the buffer output. The rise time and fall time are respectively controlled by voltages received on paths 611 and 622 (which are contained in path 176 of FIG. 1) respectively.

Current source 650 supplies the current required to discharge gate capacitor 630 to PCTRL (applied on path 256) and current source 660 supplies the current to charge gate capacitor 640 to NCTRL (applied on 257). By appropriate design of the current sources, the rate of charging and discharging can be controlled.

In operation, when input bit on path 201 equals 0, switches 670-A and 670-C are turned on, and switches 670-B and 670-D are turned off. When input bit on path 201 equals 1, switches 670-A and 670-C are turned off, and switches 670-B and 670-D are turned on. The manner in which the drive strength changes gradually when there is a transition on the buffer output is described in further detail below.

As may be appreciated, the rate at which voltage across capacitor 630 decreases from $V_{DD}$ to PCTRL is determined by the amount of current supplied by current source 650. Thus, by controlling the instantaneous current supplied by current source 650, the voltage on path 611 can be gradually decreased. As the drive strength of transistor 610 is inversely proportionate to voltage on path 611, the drive strength also changes accordingly when the buffer output transitions from 0 to 1.

Similarly, the rate at which the voltage across capacitor 640 increases from $V_{SS}$ to NCTRL is determined by the amount of current supplied by current source 660. In general, the current sources operate to alter the amount of charge on the corresponding capacitors, which in turn changes the corresponding drive strength.

Thus, by controlling the instantaneous current supplied by current source 660, the voltage on path 622 can be gradually decreased. As the drive strength of transistor 640 is directly proportionate to voltage on path 622, the drive strength also changes accordingly when the buffer output transitions from 1 to 0.

It should be appreciated that the combination of current source and capacitor provides the basis for an example implementation which gradually changes the drive strength. However, various alternative implementations which gradually change the drive strength will also be apparent to one skilled in the relevant arts by reading the disclosure provided herein. For example, one may attain a smaller-step wise change to the total drive strength (as opposed to the smooth decrease of FIGS. 4 and 5) by using appropriate voltage sources. Such alternative implementations also will be apparent to one skilled in the relevant arts.

As the drive strength changes gradually, the switching noise may be reduced in several scenarios. For example, with respect to FIG. 1, the output on path 168 also changes gradually (corresponding to the change in the drive strength). Due to the gradual change, the reflections from the transmission medium may be countered appropriately.

It should be understood that various modification may (need to) be made to the circuit of FIG. 6, depending on various requirements. For example, it may be desirable to increase the switching speed of the circuit. In addition, it may be necessary to clamp the gate voltages applied to transistors to PCTRL and NCTRL. The description is continued with reference to an example implementation which incorporates such requirements.

7. Slew Controller Block

Figure 7:
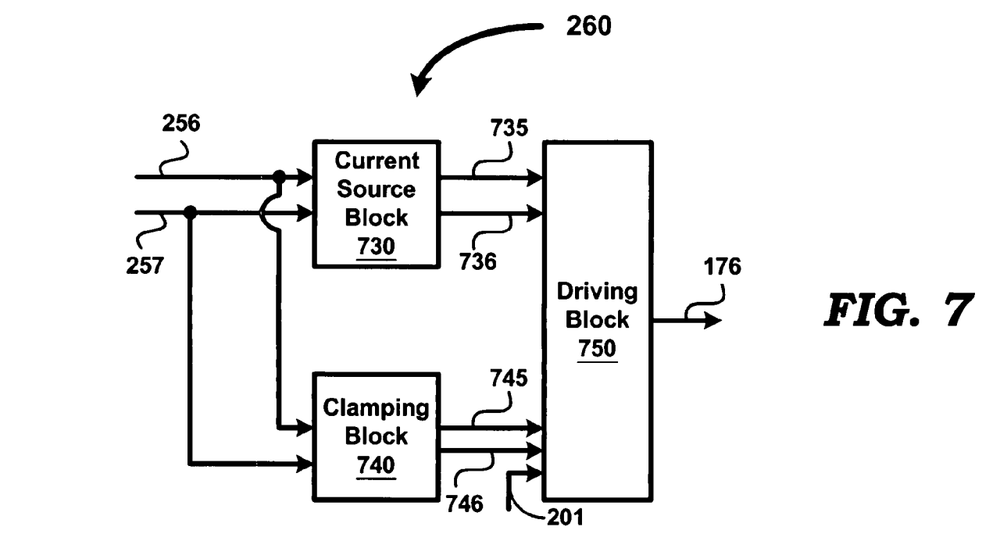
FIG. 7 is a block diagram illustrating the details of a slew controller block in one embodiment.

FIG. 7 is a block diagram illustrating the manner in which slew controller block 260 may be implemented according to an aspect of the present invention. Slew controller block 260 is shown containing current source block 730, clamping block 740, and driving block 750.

Current source block 730 generates the required current to adjust the rate of change of gate voltages received on paths 256 and 257. The voltage PCHARGE and NCHARGE representing the required current is provided on paths 735 and 736 respectively. Current source block 730 may contain current sources 650 and 660 of FIG. 6.

Clamping block 740 ensures the gate voltages applied to drive transistors equal the gate voltages received on paths 256 and 257. For example, with reference to FIG. 6, capacitor 630 discharges through current source 650 to $V_{SS}$ unless clamping block 740 clamps the voltage level equal to PCTRL. Similarly, clamping block 740 clamps the gate voltage to NCTRL when capacitor 640 charges through current source 660. Thus, clamping block 740 generates the clamping voltages PCLAMP and NCLAMP on paths 745 and 746 to clamp the gate voltages to PCTRL and NCTRL respectively.

Driving block 750 drives the drive transistors in last transistor 209-D with the slew of the gate voltage independent of PTV and load variations. Driving block 750 receives PCHARGE 735, NCHARGE 736, PCLAMP 745, NCLAMP 746, and input form ADC 150 on path 201. The manner in which current source block 730, clamping block 740, and driving block 750 may be implemented is described in sections below. First, the description is continued with reference to an example implementation of current source block 730.

8. Driving Block

Figure 8A:
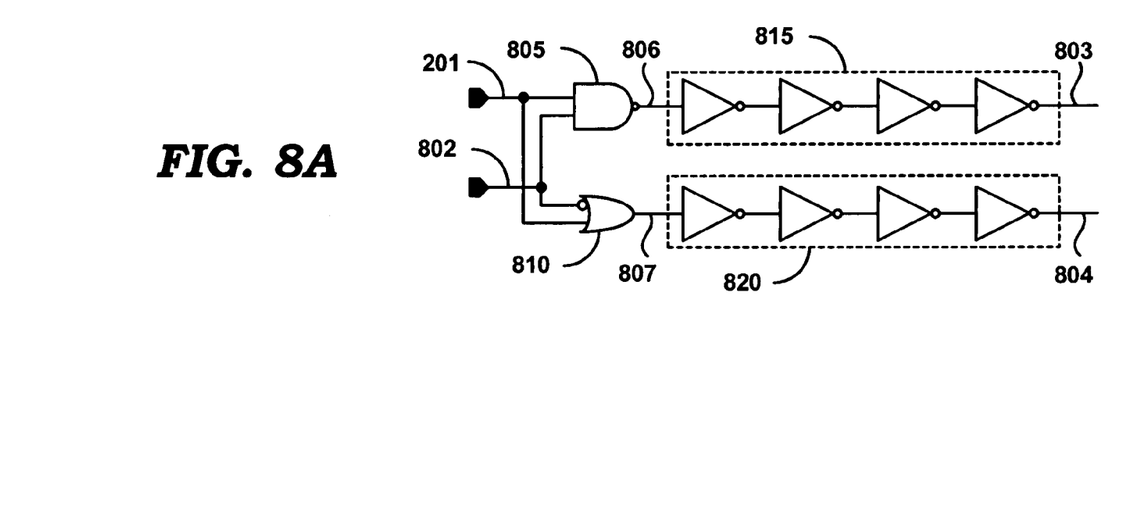
FIGS. 8A and 8B are circuit diagrams together illustrating the implementation details of a driving block in an embodiment of the present invention.
Figure 8B:
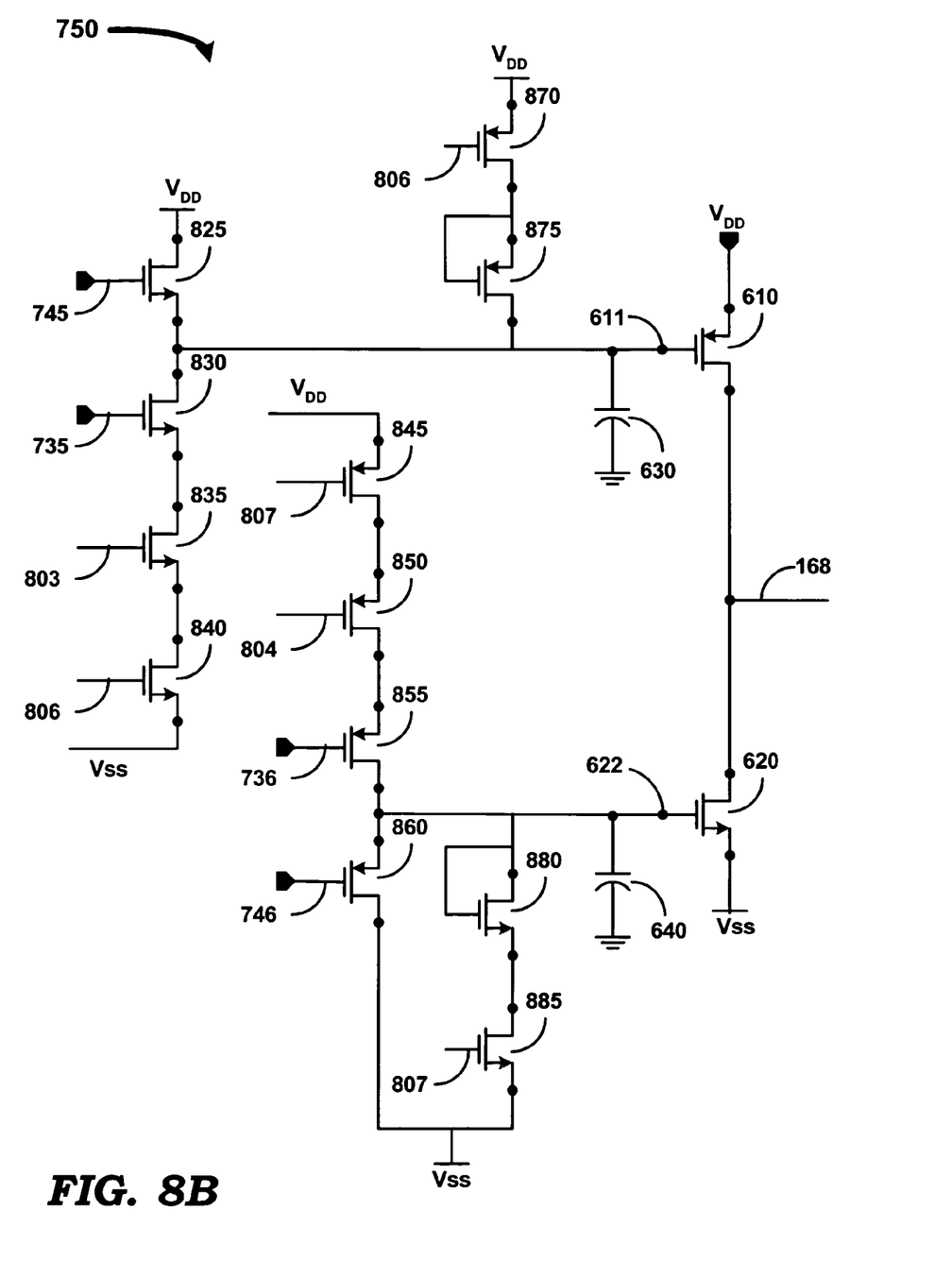

FIGS. 8A and 8B are circuit diagrams together illustrating the implementation details of driving block 750 in an embodiment of the present invention. FIG. 8A is shown containing NAND gate 805, NOR gate 810, and buffers 815 and 820, which together operate to delay input signal 201 as described below in further detail.

NAND gate 805 receives data on path 201 and OBE (output buffer enable) on path 802. A value of 1 on OBE causes the data on path 201 to be provided to last inverter 209-D output buffer 160 as described below with reference to FIG. 8B. NOR gate 810 receives data 201 and inversion of OBE 802, as represented by a bubble at the input of NOR gate 810. Both NAND gate 805 and NOR gate 810 generate inversion of data 201 when OBE is 1 and provides the output on paths 806 and 807 respectively. When OBE is 0, the outputs on paths 806 and 807 are 1 and 0 respectively.

Each of buffers 815 and 820 contain four inverter stages and generates on paths 803 and 804 a delayed version of the data received on paths 806 and 807 respectively. The manner in which the inverted and delayed data signals may be used to drive last transistor 209-D of output buffer 160 is described below with reference to FIG. 8B.

FIG. 8B is a circuit diagram illustrating the implementation details of driving block 750 in one embodiment. Driving block 750 is shown containing NMOS transistors 825, 830, 835, 840, 880, and 885, and PMOS transistors 845, 850, 855, 860, 870, and 875. Each component is described below.

The operation of the circuit (of FIG. 8B) may be best appreciated by comparison to FIG. 6. Transistors 870 and 885 respectively correspond to switches 670-B and 670-C of FIG. 6. Transistors 835 and 840 together implement switch 670-A, and transistors 845 and 850 implement switch 670-D. The description is provided first with respect to rise time and then with respect to fall time.

Thus, when inverted data 806 is at 0, PMOS transistor 870 is turned on and NMOS transistor 840 is turned off. In addition, transistor 875 provides a drop of $V_{TP}$ (wherein $V_{TP}$ represents the threshold voltage of transistor 875) as described in further detail below. As a result, capacitor 630 is charged to provide a voltage of $V_{DD}-V_{TP}$ on path 611.

When inverted data 806 changes to 1, PMOS transistor 870 is turned off and NMOS transistor 840 is turned on. Thus, transistor 840 provides a path for capacitor 630 to discharge. The amount of current required for the discharge is provided via transistor 830 by current source 650.

It may be noted that current source 650 is disconnected/switched off by turning off transistors 840 and 835 (which is the case when inverted data 806 is at 0). In such a situation, the source terminal of transistor 830 is disconnected from Vss. However, current source 650 can also be switched off by disconnecting drain terminal. By controlling the operation of current source 650, the rate of discharge and thus drive strength of PMOS transistor 610 is changed gradually. The drive strength then directly impacts the rise time of buffer output on path 168.

Thus, it may be appreciated that the drive strength is changed gradually with respect to rise time. The description is continued with respect to fall time below. The status of the relevant portions of the circuit when inverted data 807 is at 1 is described first. The change of status when inverted data 807 changes to 0 is then described.

When inverted data 807 is at 1, NMOS transistor 885 is turned on and PMOS transistor 845 is turned off. In addition, transistor 880 adds a voltage of $V_{TN}$ (wherein $V_{TN}$ represents the threshold voltage of transistor 880). As a result, capacitor 640 discharges to a voltage of $V_{TN}$.

When inverted data 807 changes to 0, NMOS transistor 885 is turned off and PMOS transistor 845 is turned on. Thus, transistor 845 provides a path for capacitor 640 to charge. The amount of current required for charging is provided via transistor 855 by current source 660. By controlling the operation of current source 660, the rate of charging and thus drive strength of NMOS transistor 620 is changed gradually.

Thus, it may be appreciated that the drive strength is changed gradually with respect to fall time as well. The description is continued with respect to other features of the circuit of FIG. 8B.

Transistor 825 receives PCLAMP 745 from clamping block 740 and ensures that the voltage on path 611 does not fall below PCTRL 256. Transistor 860 receives NCLAMP 746 from clamping block 740 and ensures that the voltage on path 622 does not exceed NCTRL 257. The operation of clamping block 740 is described in further detail in a section below.

Transistors 835 and 850 operate to reduce through current, as is desirable in several environments. Through current generally refers to the current that flows from $V_{DD}$ through $V_{SS}$ if both transistors 610 and 620 are on at the same time. The through current is reduced by ensuring that transistor 620 is turned off before transistor 610 is turned on (when a transition occurs from 1 to 0 on path 201).

Specifically, when data 807 (inverted version of data 201, as shown in FIG. 8A) transitions from 0 to 1, transistor 885 turns on immediately, which turns off transistor 620 (due to the path to $V_{SS}$). As described below, transistor 610 is turned on after a short duration.

Transistor 840 also turns on at the same time as transistor 885 due to the transition on input 806. However, transistor 835 is not turned on immediately and remains off for a short duration, due to the delayed data signal on path 803. When transistor 835 does turn on (after a delay corresponding to buffer 815), transistor 610 also turns on due to the discharging via transistors 835 and 840.

As a result, transistor 610 is turned on only after transistor 620 is turned off, avoiding/reducing any through current that may otherwise flow. Though two transistors 835 and 840 are described as being used to achieve such a feature, the feature can be implemented potentially using a single transistor as will be apparent to one skilled in the relevant arts. Through current may be similarly reduced by ensuring that transistor 620 is turned on only after transistor 610 is turned off.

PMOS transistor 875 provides a drop of $V_{TP}$, and thus applies a voltage of $V_{DD}-V_{TP}$ on path 611. By applying such a drop when transistor 610 is turned off, transistor 610 may be switched on quickly later (thereby providing a higher data throughput). Similarly, NMOS transistor 880 provides voltage of $V_{TN}$ on path 622 when transistor 620 is turned off such that transistor 620 may also be switched on quickly for a higher throughput performance. Current source block 730 and clamping block 740 are also implemented consistently as described below in further detail.

9. Current Source Block

Figure 9:
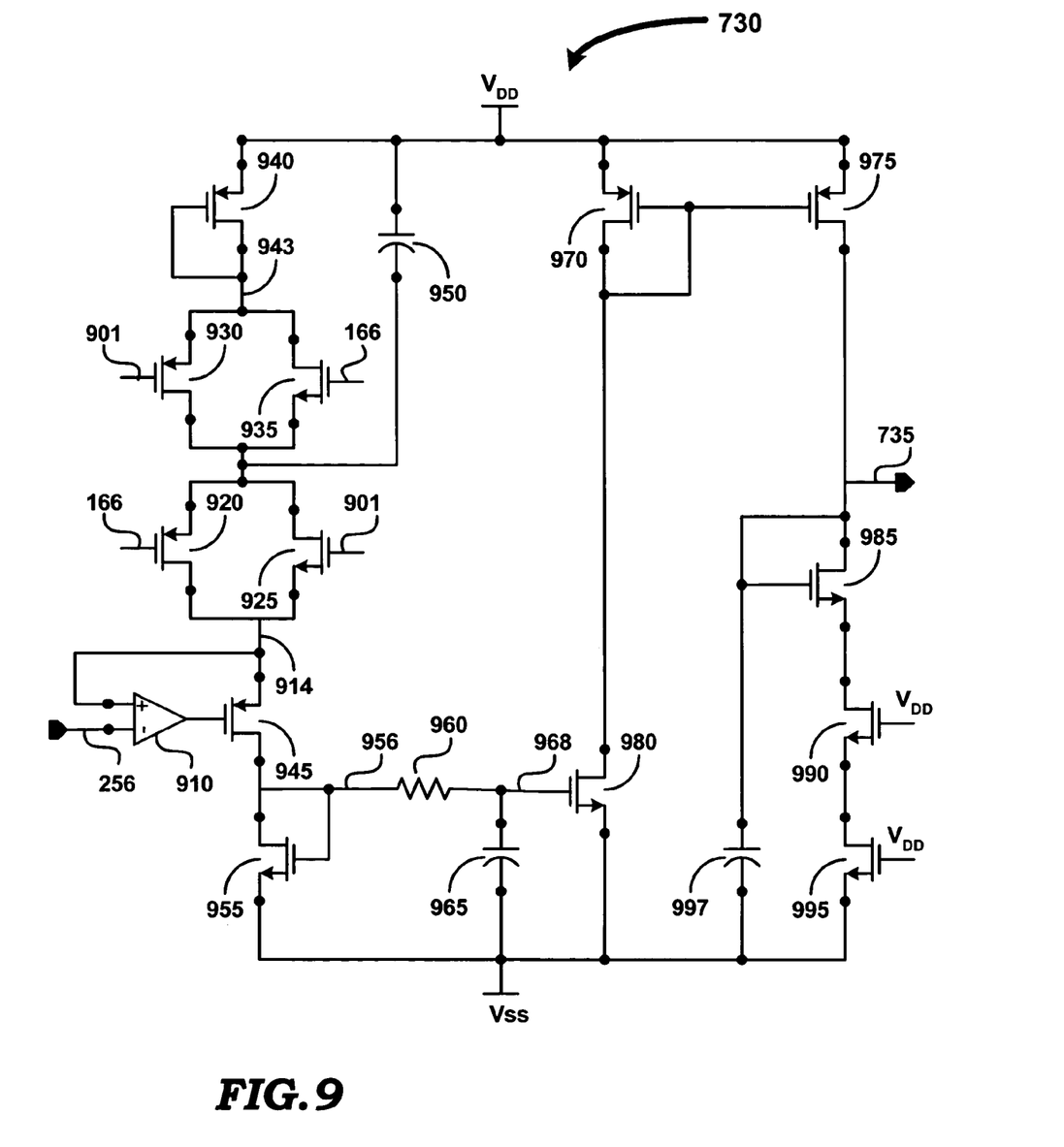
FIG. 9 is a circuit diagram illustrating the details of a current source block according to an aspect of the present invention.

FIG. 9 is a circuit diagram illustrating the details of current source block 730 in one embodiment. Current source block 730 is shown containing operational amplifier 910, PMOS transistors 920, 930, 940, 945, 970, and 975, NMOS transistors 925, 935, 955, 980, 985, 990, and 995, capacitors 950, 965, and 997, and resistor 960. Each component is described in detail below.

PMOS transistor 940 provides a drop of $V_{TP}$ (wherein $V_{TP}$ represents the threshold voltage), and thus provides a voltage of $V_{DD}$ less $V_{TP}$ on path 943. By providing such a drop, the drive transistors 610 and 620 in last inverter 209-D of output buffer 160 can be switched on quickly as described above.

Operational amplifier 910 receives PCTRL 256 on inverting terminal and the source of transistor 945 is connected to non-inverting terminal. The output of operational amplifier 910 is connected to transistor 945 to provide negative feed back. The negative feedback ensures voltage on 914 (also non-inverting terminal) to be equal to PCTRL 256. As no current flows through the inverting terminal, the current that would flow through transistor 945 equals the current that flows on path 914. The current that flows through transistor 945 in turn depends on charging and discharging of capacitor 950.

Transistors 930 and 935 together form a transmission gate. Transistor 930 receives an inversion of clock signal 166 on path 901, and transistor 935 receives clock signal on path 166. Each of the transistors 930 and 935 is turned on when clock 166 is at a logical high level. Transistors 920 and 925 together form a transmission gate. Transistor 920 receives clock signal on path 166, and transistor 925 receives inverted of clock signal 166 on path 901. Transistors 920 and 925 are turned on when clock 166 is 0 (logical low).

Capacitor 950 charges to the voltage on path 943 when clock 166 is at 1 (transistors 930 and 935 are turned on). The voltage on path 943 equals $V_{DD}-V_{TP}$, wherein $V_{TP}$ is the threshold voltage of transistor 940. Capacitor 950 discharges to the voltage PCTRL available on path 914 when clock 166 is at 0 (transistors 920 and 925 turned on).

Thus, the current on path 914 depends on the voltage levels to which capacitor 950 charges and discharges, the capacitance of capacitor 950, and the total amount of time for both charging and discharging. For example, if clk 166 is 125 MHz, the amount of time is 8 ns.

Assuming that the amount of time is T and capacitance of capacitor 950 is C2, then the current I that would flow on path 914 is given by equation (1) below.

$$I1=[(V_{DD}-V_{TP}-PCTRL)*C2]/T \quad \text{Equation (1)}$$

As described with reference to FIG. 8B above, current I1 equals the amount of current required to discharge (I2) capacitor 630 in the same duration T. I2 is given by the following equation:

$$I2=[(V_{DD}-V_{TP}-PCTRL)*C3]/T \quad \text{Equation (2)}$$

wherein C3 represents the capacitance of capacitor 630, T is the required time duration in which the charge on capacitor 630 turns on transistor 610.

It may be noted that equation (2) resembles equation (1), hence C2 needs to be designed to equal capacitance of transistor 610. A designer may select T based on the circuit specification (e.g., the desired setup/hold times for the output buffer). Current sources 630 and 640 of FIG. 6 may be implemented similar to current source block 730.

It may be further noted that the current I1 depends on PCTRL and C2, which in turn depend on PTV variations. In an embodiment, capacitor 950 is implemented as a transistor similar to transistor 610. The value of capacitor 950 also changes similar to the gate capacitance of transistor 610 with PTV variations. Therefore, the amount of current generated by current source block 730 changes with PTV variations to provide the required gate voltage in the desired time (T). As a result, the slew (rate of change) of the gate voltage is constant irrespective of PTV variations.

The other components 955, 960, 965, 970, 975, 980, 985, 990, 995 and 997 are used to process the current generated on path 914. Transistor 955 is used to provide on path 956 the mirror of the current through transistor 945 on path 956. Resistor 960 and capacitor 965 together filter the switching components in the current and provides a DC level with a small ripple on path 968. Transistors 970, 975, 980, 990, and 995, and capacitor 997 together operate to convert the current on path 968 into a voltage PCHARGE provided on path 735.

For illustration, current source block 730 is shown generating PCHARGE 735 only, however, current source block 730 also generates NCHARGE 736 using the similar circuit diagram shown in FIG. 9 except the input on path 256 is 257 and output on path 735 provides NCHARGE 736. The description is continued with reference to an implementation of clamping block 740 in one embodiment of the present invention.

10. Clamping Block

Figure 10:
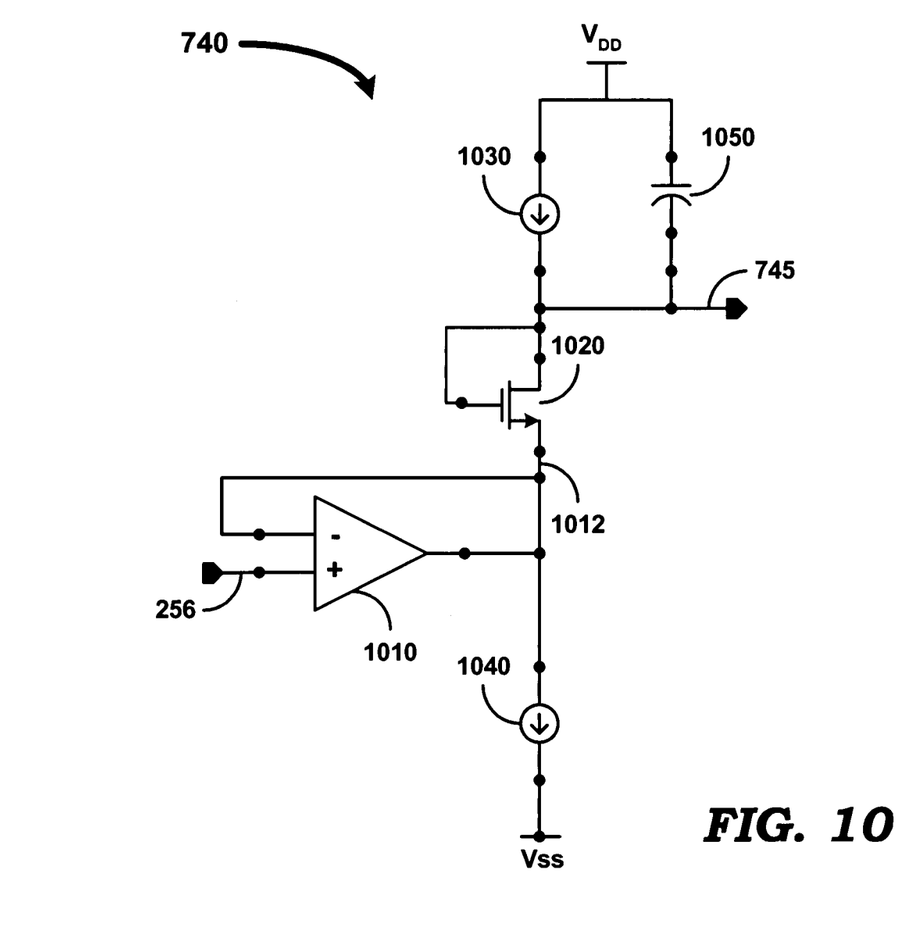
FIG. 10 is a circuit diagram illustrating the details of a clamping block in an embodiment of the present invention.

FIG. 10 is a circuit diagram illustrating the details of clamping block 740 in an embodiment. Clamping block 740 is shown containing operational amplifier 1010, NMOS transistor 1020, current sources 1030 and 1040, and capacitor 1050. Each component is described below.

Operational amplifier 1010 receives PCTRL 256 on non-inverting terminal and the output is connected to inverting terminal in a feedback configuration. The output of operational amplifier 1010 is connected to the source terminal of transistor 1020 to provide a negative feedback. Due to the negative feedback and high amplifier gain, the voltage at inverting terminal (and also on path 1012) would also equal PCTRL.

Transistor 1020 may be implemented similar to transistor 825 of FIG. 8B. The voltage on path 745, PCLAMP, equals PCTRL+$V_{TN}$ (wherein $V_{TN}$ represents the threshold voltage of transistor 1020). PCLAMP is used to clamp the gate voltage of transistor 610 to PCTRL.

Current sources 1030 and 1040 supply the required current to provide the PCLAMP. Capacitor 1050 is used to provide biasing to transistor 1020 and filter any switching components in PCLAMP. For illustration, clamping block 740 is shown generating PCLAMP 745 only, however, clamping block 740 also generates NCLAMP 746 using the similar circuit diagram shown in FIG. 10 except the path 257 would replace path 256, and output on path 745 provides NCLAMP 746. The description is continued with reference to an implementation of driving block 750 in one embodiment of the present invention.

From the above, it may be noted that the switching noise due to several sources may be reduced by changing the strength of an output buffer gradually. Even if the output of output buffer is changing gradually, the data available time is maintained substantially the same as when the drive strength is not changed gradually since the output signal changes gradually in the case of both falling and rising edges. The output buffer may be used to drive any load, for example, capacitive load presented by another integrated circuit, inductive load presented by a transmission line, etc. In addition, the avoidance/reduction of switching noise is attained in various operating conditions.

11. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An integrated circuit comprising:
   an output buffer receiving a first value followed by a second value, wherein said first value is not equal to said second value;
   a voltage adjusting block to determine a total strength to be applied to said output buffer; and
   a control block changing a strength of said output buffer gradually while said output buffer provides said second value as a buffer output to reach said total strength, wherein said output buffer comprises a drive transistor, and wherein said control block comprises:
   a capacitor provided at a gate terminal of said drive transistor; and
   a current source for altering the total charge on said capacitor slowly to change said strength gradually.

2. The integrated circuit of claim 1, wherein said capacitor comprises a gate capacitance of said drive transistor.

3. The integrated circuit of claim 1, wherein said output buffer comprises a plurality of inverters, wherein one of said plurality of inverters comprises said drive transistor.

4. The integrated circuit of claim 1, wherein said drive transistor is contained in a last one of said plurality of inverters.

5. The integrated circuit of claim 1, wherein said drive transistor comprises a PMOS transistor, wherein said current source discharges said capacitor to control said drive strength when said second value is greater than said first value.

6. The integrated circuit of claim 5, wherein said control block comprises:
   a voltage adjusting block which determines the total strength to be applied to said drive transistor when said second value is greater than said first value, and provides a PCTRL signal representing said total strength; and
   a slew controller block coupled to said drive transistor, said slew controller block containing said current source, wherein said current source receives said PCTRL to determine the amount of current to supply to discharge said capacitor.

7. The integrated circuit of claim 6, wherein said control block comprises:
   a delay module delaying a clock signal to generate a delayed clock signal, wherein said clock signal is used to control the timing of reception of said first value and said second value; and
   a comparator comparing said buffer output with a threshold voltage to determine whether said buffer output is rising at a desired rate, said comparator providing a comparison result,
   wherein said voltage adjusting block adjusts said total strength according to said comparison result.

8. The integrated circuit of claim 7, wherein said voltage adjusting block adjusts said total strength in multiple increments until said total strength equals a desired strength, wherein said desired strength is determined by said desired rate.

9. The integrated circuit of claim 6, wherein said current source comprises:
   a first transmission gate which conducts in one logical state of a clock signal and does not conduct on the other logical state of said clock signal, said first transmission gate being connected between a first node and a second node, said second node being coupled to a supply voltage;
   a second transmission gate being connected between said first node and a third node, said second transmission gate conducting in said other logical state of said clock signal and not conducting in said one logical state of said clock signal, said third node being coupled to receive said PCTRL; and
   a second capacitor coupled between said first node and said voltage supply, wherein a desired amount of current to discharge said capacitor is generated at said third node.

10. The integrated circuit of claim 9, wherein the capacitance of said second capacitor equals the capacitance of said capacitor.

11. The integrated circuit of claim 10, wherein said current source further comprises a drop transistor connected between said supply voltage and said second node, said drop transistor providing a voltage drop to apply a voltage of said supply voltage less said voltage drop at said second node so as to switch off said drive transistor.

12. The integrated circuit of claim 11, further comprising:
   a second drop transistor provided between said supply voltage and a gate terminal of said PMOS transistor, wherein said second drop transistor also provides said voltage drop to apply a voltage of said supply voltage less said voltage drop at said gate terminal of said PMOS transistor.

13. The integrated circuit of claim 12, further comprising a clamping circuit to clamp the voltage at the gate terminal of said PMOS transistor to said PCTRL.

14. The integrated circuit of claim 12, further comprising a clamping
   circuit to clamp the voltage at the gate terminal of said NMOS transistor to said NCTRL.

15. The integrated circuit of claim 5, wherein said control block comprises:
   a voltage adjusting block which determines a total strength to be applied to said drive transistor when said second value is less than said first value, and provides a NCTRL signal representing said total strength; and
   a slew controller block coupled to said drive transistor, said slew controller block containing said current source, wherein said current source receives said NCTRL to determine the amount of current to supply to discharge said capacitor.

16. The integrated circuit of claim 15, wherein said control block comprises:
   a delay module delaying a clock signal to generate a delayed clock signal, wherein said clock signal is used to control the timing of reception of said first value and said second value; and
   a comparator comparing said buffer output with a threshold voltage to determine whether said buffer output is falling at a desired rate, said comparator providing a comparison result,
   wherein said voltage adjusting block adjusts said total strength according to said comparison result.

17. The integrated circuit of claim 1, wherein said drive transistor comprises a NMOS transistor, wherein said current source charges said capacitor to control said drive strength when said second value is less than said first value.

18. The integrated circuit of claim 1, wherein said strength is changed such that an output signal of said output buffer changes from a first voltage level representing said first value to a second voltage level representing said second value in a duration which is substantially more than 15% of a clock cycle duration.

19. The integrated circuit of claim 18, wherein said duration equals at least 40% of said clock cycle duration.

20. A device comprising:
an output buffer receiving a first value followed by a second value, wherein said first value is not equal to said second value;
a voltage adjusting block to determine a total strength applied to said output buffer; and
a control block changing a strength of said output buffer gradually while said output buffer provides said second value as a buffer output to reach said total strength, wherein said output buffer comprises a drive transistor, and wherein said control block comprises:
a capacitor provided at a gate terminal of said drive transistor;
a current source for altering the total charge on said capacitor slowly to change said strength gradually.

21. The device of 20, wherein said capacitor comprises a gate capacitance of said drive transistor.

22. The device of claim 20, wherein said output buffer comprises a plurality of inverters, wherein one of said plurality of inverters comprises said drive transistor.

23. The device of claim 22, wherein said drive transistor is contained in a last one of said plurality of inverters.

24. The device of claim 20, wherein said drive transistor comprises a PMOS transistor, wherein said current source discharges said capacitor to control said drive strength when said second value is greater than said first value.

25. The device of claim 24, wherein said control block comprises:
a voltage adjusting block which determines a total strength to be applied to said drive transistor when said second value is greater than said first value, and provides a PCTRL signal representing said total strength; and
a slew controller block coupled to said drive transistor, said slew controller block containing said current source, wherein said current source receives said PCTRL to determine the amount of current to supply to discharge said capacitor.

26. The device of claim 25, wherein said control block comprises:
a delay module delaying a clock signal to generate a delayed clock signal, wherein said clock signal is used to control the timing of reception of said first value and said second value; and
a comparator comparing said buffer output with a threshold voltage to determine whether said buffer output is rising at a desired rate, said comparator providing a comparison result,
wherein said voltage adjusting block adjusts said total strength according to said comparison result.

27. The device of claim 26, wherein said voltage adjusting block adjusts said total strength in multiple increments until said total strength equals a desired strength, wherein said desired strength is determined by said desired rate.

28. The device of claim 25, wherein said current source comprises:

a first transmission gate which conducts in one logical state of a clock signal and does not conduct on the other logical state of said clock signal, said first transmission gate being connected between a first node and a second node, said second node being coupled to a supply voltage;
a second transmission gate being connected between said first node and a third node, said second transmission gate conducting in said other logical state of said clock signal and not conducting in said one logical state of said clock signal, said third node being coupled to receive said PCTRL; and
a second capacitor coupled between said first node and said voltage supply, wherein a desired amount of current to discharge said capacitor is generated at said third node.

29. The device of claim 28, wherein the capacitance of said second capacitor equals the capacitance of said capacitor.

30. The device of claim 29, wherein said current source further comprises a drop transistor connected between said supply voltage and said second node, said drop transistor providing a voltage drop to apply a voltage of said supply voltage less said voltage drop at said second node.

31. The device of claim 30, further comprising:
a second drop transistor provided between said supply voltage and a gate terminal of said PMOS transistor, wherein said second drop transistor also provides said voltage drop to apply a voltage of said supply voltage less said voltage drop at said gate terminal of said PMOS transistor.

32. The device of claim 31, further comprising a clamping circuit to clamp the voltage at the gate terminal of said PMOS transistor to said PCTRL.

33. The device of claim 31, further comprising a clamping circuit to clamp the voltage at the gate terminal of said NMOS transistor to said NCTRL.

34. The device of claim 24, wherein said control block comprises:
a voltage adjusting block which determines a total strength to be applied to said drive transistor when said second value is less than said first value, and provides a NCTRL signal representing said total strength; and
a slew controller block coupled to said drive transistor, said slew controller block containing said current source, wherein said current source receives said NCTRL to determine the amount of current to supply to discharge said capacitor.

35. The device of claim 34, wherein said control block comprises:
a delay module delaying a clock signal to generate a delayed clock signal, wherein said clock signal is used to control the timing of reception of said first value and said second value; and
a comparator comparing said buffer output with a threshold voltage to determine whether said buffer output is falling at a desired rate, said comparator providing a comparison result,
wherein said voltage adjusting block adjusts said total strength according to said comparison result.

36. The device of claim 20, wherein said drive transistor comprises a NMOS transistor, wherein said current source charges said capacitor to control said drive strength when said second value is less than said first value.

37. The device of claim 20, wherein said strength is changed such that an output signal of said output buffer changes from a first voltage level representing said first value to a second voltage level representing said second value in a duration which is substantially more than 15% of a clock cycle duration.

38. The device of claim 37, wherein said duration equals at least 40% of said clock cycle duration.

39. The device of claim 20, wherein said device further comprises a load receiving said buffer output.

40. The device of claim 39, wherein said load comprises a transmission line.

41. The device of claim 20, wherein said device comprises a wireless base station, said device further comprising:
an antenna receiving an external signal; and
an analog processor processing said external signal to generate said first value and said second value.

42. An apparatus comprising:
an output buffer receiving a transition from a first value to a second value, wherein said first value is not equal to said second value, said buffer rroviding said first value followed by said second value on a buffer output;
a voltage adjusting block to determine a total strength to be appied to said output buffer; and
means for changing a strength of said output buffer gradually while providing said second value on said buffer output to reach said total strength, wherein said output buffer comprises an inverter containing a transistor, wherein said means for changing alters slowly an amount of charge on a capacitor provided at a gate terminal of said transistor.

43. The apparatus of claim 42, wherein said capacitor comprises a gate capacitance of said gate terminal.

44. The apparatus of claim 42, wherein said means for changing comprises a current source to perform said altering.

45. A method of processing a transition from a first value to a second value, wherein said first value is not equal to said second value, said method comprising:
receiving said first value followed by said second value on a buffer input of an output buffer;
providing said first value on a buffer output of said output buffer;
determining a total strength of said output buffer; and
changing a strength of said output buffer gradually while providing said second value on said buffer output to reach said total strength, wherein said output buffer comprises an inverter containing a transistor, said changing comprises altering slowly an amount of charge on a capacitor provided at a gate terminal of said transistor.

46. The method of claim 45, wherein said capacitor comprises a gate capacitance of said gate terminal.

47. The method of claim 45, wherein said changing is performed using a current source.

48. The method of claim 47, wherein said strength is changed such that an output signal of said output buffer changes from a first voltage level representing said first value to a second voltage level representing said second value in a duration which is substantially more than 15% of a clock cycle duration using which said first value and said second value are received.

49. The method of claim 48, wherein said duration equals at least 40% of said clock cycle duration.

* * * * *